United States Patent [19]
Kim et al.

[11] Patent Number: 5,885,404
[45] Date of Patent: Mar. 23, 1999

[54] PEDESTAL WITH SELF RETAINING SEALING RING FOR SEMICONDUCTOR DEVICE ETCHING SYSTEM

[75] Inventors: Sang-ho Kim; Tae-hyung Lim, both of Kyungki-do, Rep. of Korea

[73] Assignee: Samsung Electronics Co., Ltd., Suwon, Rep. of Korea

[21] Appl. No.: 963,845

[22] Filed: Nov. 4, 1997

[30] Foreign Application Priority Data

Nov. 5, 1996 [KR] Rep. of Korea ................ 1996-52147

[51] Int. Cl.$^6$ ...................................... C23F 1/02
[52] U.S. Cl. ...................... 156/345; 118/500; 118/728
[58] Field of Search .................. 156/345; 118/728, 118/500

[56] References Cited

U.S. PATENT DOCUMENTS 5,492,566  2/1996  Sumnitsch ................ 118/500
5,569,350 10/1996  Osada et al. ............. 156/345

*Primary Examiner*—R. Bruce Breneman
*Assistant Examiner*—Shamim Ahmed
*Attorney, Agent, or Firm*—Myers, Bigel, Sibley & Sajovec

[57] ABSTRACT

A pedestal for a semiconductor device etching system includes a pedestal body having a circumferential recess. The recess includes a cutaway area extending radially inwardly therefrom. The pedestal further includes a sealing ring configured to mate with the pedestal body recess. The sealing ring includes a radially inwardly-extending projection that resides within the cutaway area of the recess. Because the sealing ring projection fits within and is retained by the cutaway area of the recess, the sealing ring remains in place upon removal of the mounted wafer even if it adheres somewhat to the wafer.

8 Claims, 2 Drawing Sheets

PEDESTAL WITH SELF RETAINING SEALING RING FOR SEMICONDUCTOR DEVICE ETCHING SYSTEM

FIELD OF THE INVENTION

The present invention relates to the etching of semiconductor devices, and more particularly to a mounting pedestal on which a wafer to be etched is mounted.

BACKGROUND OF THE INVENTION

Lithography is a commonly used technique for etching a desired pattern into a substrate, such as a semiconductor device. Typically, the substrate to be etched is secured into place with a securing device opposite a radiation source. A lithography mask is mounted between the radiation source and the substrate. The lithography mask is formed of a material that is opaque to radiation produced by the source but includes a radiation-transparent window with an opaque pattern. When the radiation source is activated, radiation emitted therefrom travels through the transparent portions of the window to the substrate but is prevented from passing through the opaque portions. A photoresist on the substrate is exposed in the desired pattern by the radiation passing through the transparent portions of the mask window. The photoresist is then developed and then used as a mask to etch the substrate.

Generally, semiconductor wafers to be etched are mounted on the upper surface of a pedestal positioned within a processing chamber. The position of the wafer relative to the upper surface and the radiation source can be adjusted by lift pins that extend through the pedestal body. The pedestal body also typically includes a cooling gas flow passage having an outlet positioned at the center of the pedestal upper surface. Helium is supplied to the passage for cooling the mounted wafer. This cooling prevents a photoresist layer on the wafer from burning due to high frequency voltage applied to the pedestal during exposure to the radiation and etching.

Typically, an elastomeric sealing ring is fixed on the circumferential edge of the upper surface of the pedestal. The sealing ring provides a seal between the bottom of the wafer and the upper surface of the pedestal. The sealing ring is usually V-shaped in cross-section, with the legs and vertex of the "V" fitting within an angled recess in the circumferential edge of the pedestal upper surface. With the sealing ring in place in the recess, one leg thereof projects above the upper surface of the pedestal and contacts the bottom surface of the wafer.

Unfortunately, during processing the sealing ring may adhere to the bottom of the wafer, as its surface contacting the wafer can melt due to the wafer's elevated processing temperature. When such melting occurs, lifting of the wafer by the lift pins also lifts the sealing ring and pulls it from the pedestal recess. This action can result in processing defects due to the leak formed between the sealing ring and the pedestal recess.

In addition, the sealing ring is typically formed of an elastomer having a Rockwell A hardness of 80A. This value is the result of more than 15 percent of the elastomeric material comprising inorganic filler added to reduce the material cost. Because of the presence of the filler, the elasticity of the material is reduced. The drop in elasticity can cause the sealing ring to deform during insertion on the pedestal which can, in turn, increase the chance of the sealing ring being unable to provide a seal.

SUMMARY OF THE INVENTION

In view of the foregoing, it is an object of the present invention to provide a pedestal for a semiconductor device etching system that prevents the sealing ring from separating from the pedestal body as a wafer is removed from the pedestal after processing.

It is another object of the present invention to provide a sealing ring with increased elasticity so that leaks between the sealing ring and pedestal are reduced.

These and other objects are satisfied by the present invention, which is directed to a mounting pedestal for a semiconductor device etching system that includes a self-retaining ring. The pedestal includes a pedestal body having a circumferential recess. The recess includes a cutaway area extending radially inwardly therefrom. The pedestal further includes a sealing ring configured to mate with the pedestal body recess. The sealing ring includes a radially inwardly-extending projection that resides within the cutaway area of the recess. Because the sealing ring projection fits within and is retained by the cutaway area of the recess, the sealing ring remains in place upon removal of the mounted wafer even if it adheres somewhat to the wafer.

In a preferred embodiment, the sealing ring is formed of an elastomeric material having a Rockwell A hardness of about 74A. A sealing ring with these properties is less likely to experience permanent deformation during installation than harder, less elastic materials used in prior art sealing rings.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like structures throughout.

Figure 1:
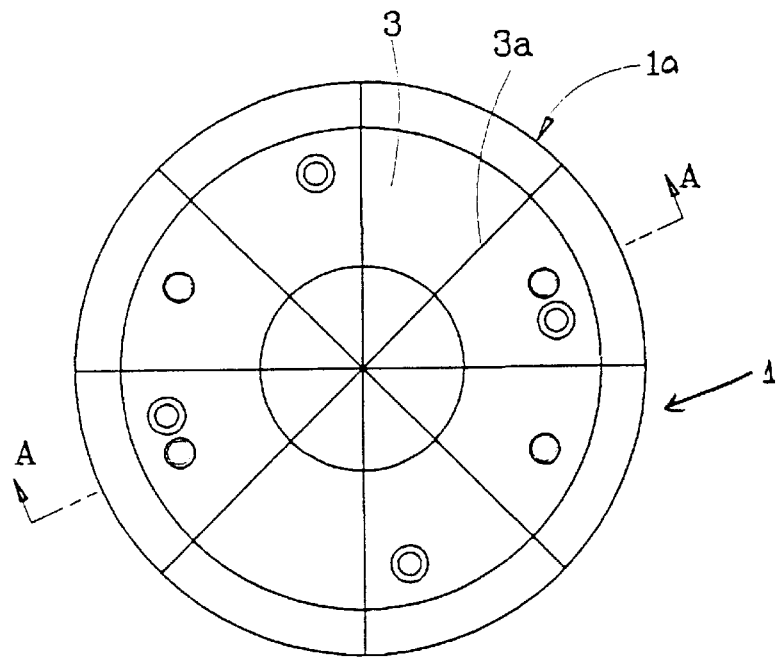
FIG. 1 is a plan view of a prior art mounting pedestal and sealing ring.
Figure 2:
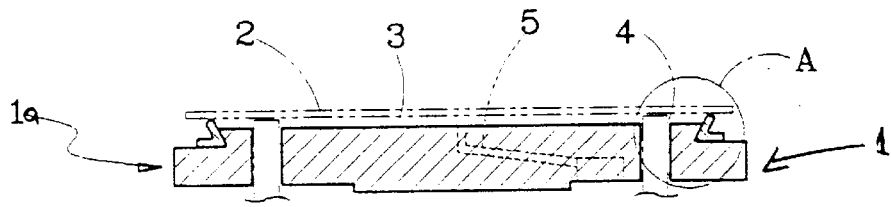
FIG. 2 is a cross-sectional view of the mounting pedestal taken along line A—A of FIG. 1.
Figure 3:
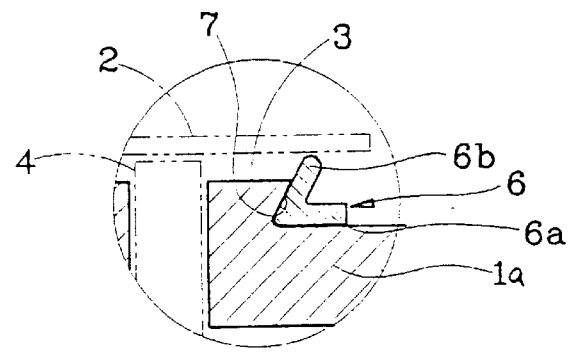
FIG. 3 is an enlarged view of the encircled portion of FIG. 2.

Referring now to the figures, a prior art pedestal, designated broadly at 1, is illustrated in FIGS. 1 through 3. The pedestal includes a pedestal body 1*a* having an upper surface 3. A wafer 2 to be etched is mounted on the upper surface 3. A trio of lift pins 4 extend through the pedestal body 1*a* to adjust the position of the wafer 2 relative to the upper surface 3. The pedestal body 1*a* also includes a gas flow passage 5 having an outlet positioned at the upper surface 3 through which helium can be supplied for cooling the mounting wafer 2. Eight radially extending grooves 3*a* extend from the outlet of the passage 5 to distribute the helium evenly over the lower surface of the wafer 2.

A sealing ring 6 (FIGS. 2 and 3) fits within a recess 7 on the pedestal body 1*a*. The sealing ring 6 includes a horizontal surface 6*a* and an inclined surface 6*b*; these intersect such that the sealing ring 6 has a V-shaped cross section. The sealing ring 6 fits within a V-shaped recess 7 that extends about the circumferential edge of the pedestal body 1a. As can be best seen in FIG. 3, the wafer 2 rests upon the upper portion of the inclined surface 6b. It is at this point that the seal is formed between the sealing ring 6 and the bottom surface of the wafer 2.

Figure 4:
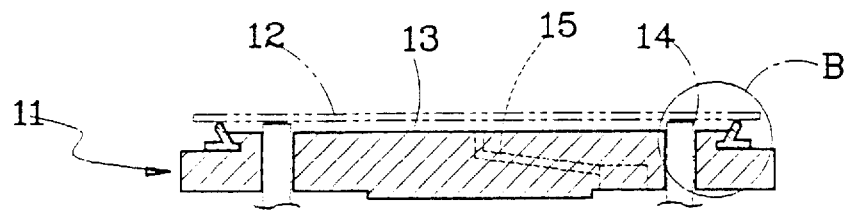
FIG. 4 is a cross-sectional view of a pedestal and sealing ring according to the present invention.

Referring now to FIG. 4, a pedestal of the present invention, designated broadly at 10, is shown. The pedestal 10 comprises a pedestal body 11 having an upper surface 13 upon which a wafer 12 is mounted. Also, lift pins 14 extend through apertures 14a in the pedestal body 11 for raising and lowering the wafer 12 relating to the upper surface 13. A cooling gas flow passage 15 is formed through the pedestal body 11 for supplying helium to cool the wafer 12. Gas flow grooves (not shown in FIGS. 4 and 5) are formed on the upper surface 13 of the pedestal body 11 that distribute the helium uniformly over the wafer 12.

Figure 5:
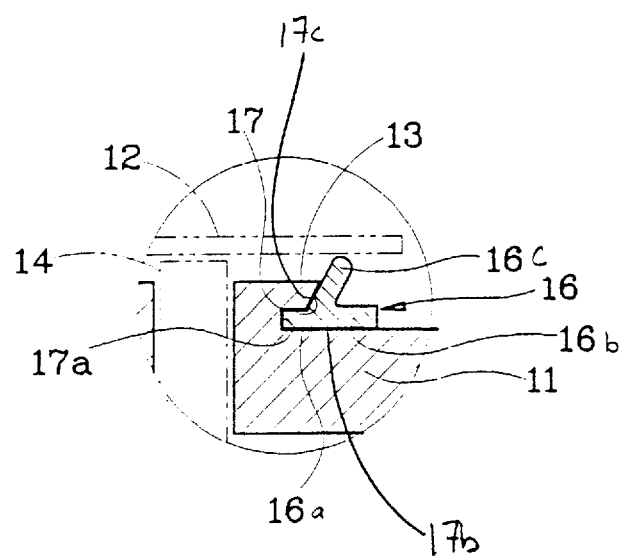
FIG. 5 is an enlarged view of the encircled portion of FIG. 4.

Referring now to FIG. 5, a recess 17 is formed along the circumferential edge of the pedestal body 11. The recess 17, which includes a cutaway area 17a that extends radially inwardly, is defined by a horizontal surface 17b and an inclined surface 17c.

Referring again to FIG. 5, a sealing ring 16 is positioned in the recess 17 of the pedestal body 11. The sealing ring 16 includes a horizontal surface 16b and an inclined surface 16c that mate with, respectively, the horizontal surface 17b and the inclined surface 17c of the recess 17. A projection 16a extends radially inwardly from the intersection of surfaces 16b, 16c and fits within the cutaway area 17a.

The sealing ring 16 is preferably formed of an elastomeric material, such as natural or synthetic rubber. It is desirable to increase the elasticity of the material, which can be accomplished by reducing its hardness. Preferably, the hardness of the sealing ring 16 should be about Rockwell 74A. This hardness value can be achieved by controlling the amount of inorganic filler included in the material.

The presence of the projection 16a on the sealing ring 16 prevents the sealing ring 16 from being removed from the pedestal body 11 during the processing of wafers. When the wafer 12 is ejected by the lift pins 14, the sealing ring 16 is not loosened from the pedestal 11, as the projection 16a of the sealing ring 16 is snugly secured in the cutaway area 17a of the recess 17. Therefore, any leak due to the sealing ring 16 being shifted from its position relative to the pedestal body 11 is prevented, and the sealing ring 16 maintains its position relative to the pedestal body 11 and the wafer 12.

Further, the high elasticity of the sealing ring 16 enables it to maintain its original shape during its initial fitting on the pedestal. Accordingly, the sealing ring 16 can more efficiently prevent any leak between the wafer 12 and the pedestal body 11.

It will be apparent to those skilled in the art that various modifications and variations can be made in the wafer spincoating system of the present invention without departing from the spirit or scope of the invention. Thus, it is intended that the present invention cover the modifications and variations of this invention provided they come within the scope of the appended claims and their equivalents.

That which is claimed is:

1. A pedestal for a semiconductor device etching system, said pedestal comprising:

a pedestal body having a circumferential recess, said recess including a cutaway area extending radially inwardly therefrom; and a sealing ring configured to mate with said pedestal body recess, said sealing ring including a radially inwardly-extending projection that resides within said cutaway area.

2. The pedestal defined in claim 1, wherein said pedestal body recess includes a horizontal surface and an inclined surface, and wherein said sealing ring includes horizontal and inclined surfaces that mate with said pedestal body recess horizontal and inclined surfaces.

3. The pedestal defined in claim 1, wherein said sealing ring projection extends from the intersection of said horizontal and inclined surfaces of sealing ring.

4. The pedestal defined in claim 1, wherein the hardness of said sealing ring is Rockwell 74A.

5. A semiconductor device etching system, comprising:

a pedestal body having a circumferential recess, said recess including a cutaway area extending radially inwardly therefrom;

a sealing ring configured to mate with said pedestal body recess, said sealing ring including a radially inwardly-extending projection that resides within said cutaway area; and a wafer positioned above said pedestal body and contacting said sealing ring such that a seal is formed between said wafer and said sealing ring.

6. The etching system defined in claim 5, wherein said pedestal body recess includes a horizontal surface and an inclined surface, and wherein said sealing ring includes a horizontal and inclined surfaces that mate with said pedestal body recess horizontal and inclined surfaces.

7. The etching system defined in claim 5, wherein said sealing ring projection extends from the intersection of said horizontal and inclined surfaces of sealing ring.

8. The etching system defined in claim 5, wherein the hardness of said sealing ring is Rockwell 74A.

* * * * *